United States Patent [19]

Joly et al.

[11] 3,793,175

[45] Feb. 19, 1974

[54] THIN FILM CIRCUITS WITH INTERCONNECTING CONTACTS

[75] Inventors: Jean Joly; Michel Moulin, both of Paris, France

[73] Assignee: Societe Lignes Telegraphiques Et Telephoniques, Paris, France

[22] Filed: Oct. 20, 1971

[21] Appl. No.: 190,906

[30] Foreign Application Priority Data

Nov. 5, 1970 France........................ 70.39766

[52] U.S. Cl. .................................................. 204/192

[51] Int. Cl.............................................. C23c 15/00

[58] Field of Search.................................... 204/192

[56] References Cited

UNITED STATES PATENTS 3,718,565 2/1973 Pelletier............................. 204/192

3,242,006 3/1966 Gerstenberg........................ 204/192

3,382,053 5/1968 Altman................................ 29/194

*Primary Examiner*—John H. Mack

*Assistant Examiner*—D. R. Valentine

*Attorney, Agent, or Firm*—Kemon, Palmer & Estabrook

[57] ABSTRACT

In thin film circuits made of tantalum nitride an underlayer of tantalum is provided on the tantalum nitride layer before deposition of the contact metal layer. It is preferred to deposit the three layers in the same vacuum equipment, and to successively etch first the contacts and then the circuit pattern.

4 Claims, 7 Drawing Figures

THIN FILM CIRCUITS WITH INTERCONNECTING CONTACTS

BACKGROUND OF THE INVENTION AND PRIOR ART

The present invention concerns the building up of ohmic contacts on thin-film circuits and more particularly on circuits consisting of components formed of tantalum and/or of compounds of this metal, such as the oxide, the nitride, etc. Such circuits are well known to the person skilled in the art and networks comprising resistors, capacitors and inductors produced by this technique are described for instance in U.S. Pat. No. 3,406,043, applied for on the 9 Nov., 1964.

The present invention relates to the building up of an ohmic contact of high electric and mechanical quality on resistor circuits produced by the aforesaid technique, wherein, for well-known reasons of ageing the resistive network is formed by a pattern designed from a layer of tantalum nitride. The applicants' British Patent No. 1,249,479 discloses the building up of localised contacts or plugs of precious metal on a circuit consisting of a layer of tantalum. The results obtained by the application of the process according to the said patent when the layer of tantalum is replaced by a layer of nitride are insufficiently reliable to be relied upon in the case of mass production.

The present invention concerns essentially a process which ensures the building up of reliable ohmic contacts having high mechanical strength in circuits consisting of patterns of tantalum nitride.

BRIEF DISCLOSURE OF THE INVENTION

According to the invention, the process includes the use of a non-nitrided metallic tantalum underlayer between the tantalum nitride pattern and the precious metal constituting the contact. This underlayer is intended only to provide mechanical adhesion of the metal of the contact to the tantalum nitride layer. In accordance with another feature of the invention, the intermediate tantalum underlayer may also be used for the purpose of adjusting and/or passivating the resistors of the circuit. The ohmic contacts in accordance with the present invention may be industrially obtained by successive depositions of all the layers constituting the circuit and its connections over the whole of the surface of the substrate and subsequent selective engravings of the various layers. This preferred procedure, which is illustrated in the following description, renders possible an extensive mechanisation of the manufacture and ensures very high reliability and reproducibility. The basic reason resides in that the various thin films constituting the completed circuit are successively deposited in the same set-up without the vacuum being broken.

DETAILED DESCRIPTION

Figure 3:
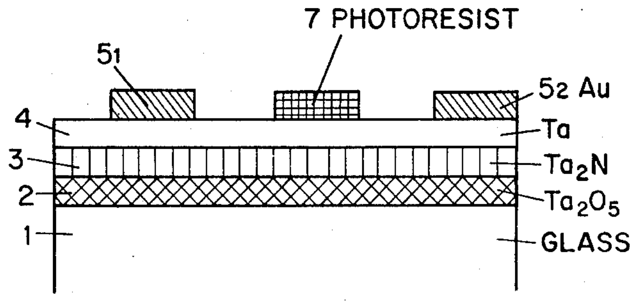
Figure 4:
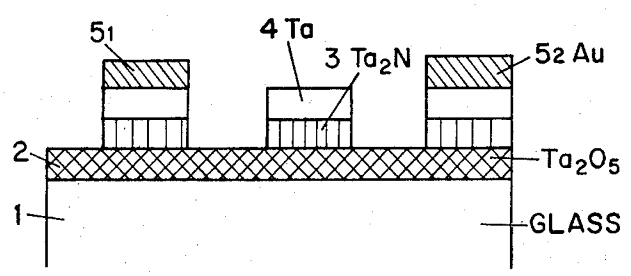
Figure 5:
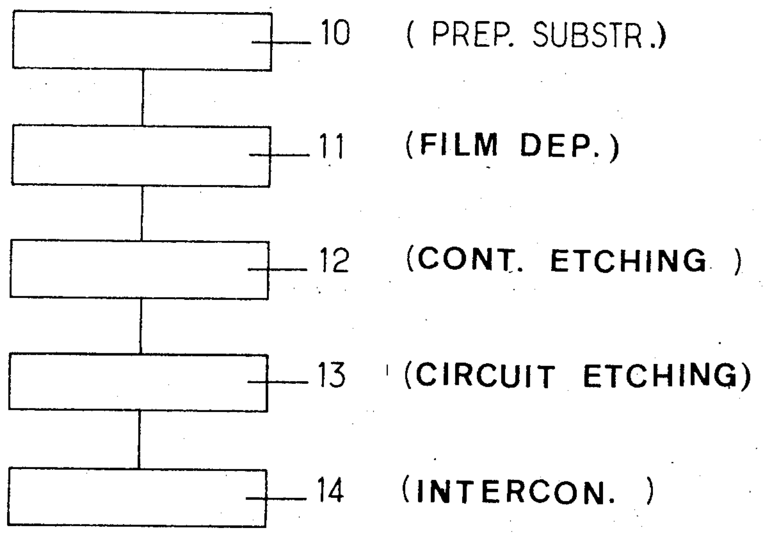
Figure 6:
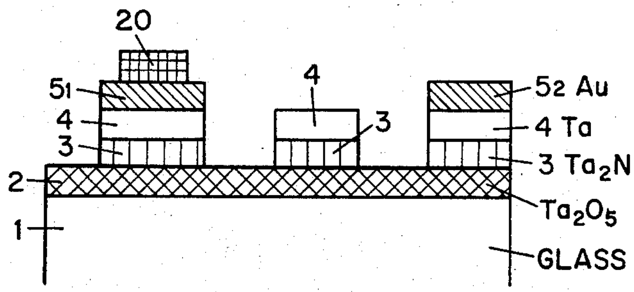
Figure 7:
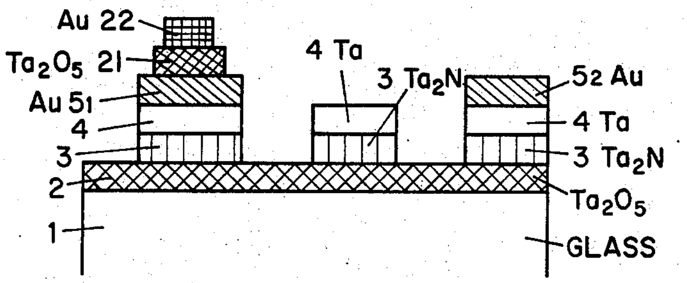

The invention will be readily understood from the following description and with reference to the accompanying figures, which are given by way of non-limiting illustration, and in which:

FIGS. 1 to 4 illustrate the various stages of the manufacture leading to the building up of the contacts according to the invention on a resistor network circuit, FIG. 5 is a block diagram of one embodiment of the invention, and FIGS. 6 and 7 illustrate applications of the process of the invention to a hybrid circuit and to a RC network circuit respectively.

Figure 1:
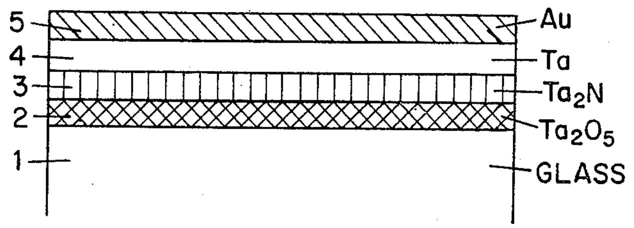

FIG. 1 is a sectional view of a thin film circuit consisting of an insulating substrate 1, for example of glass, bearing all the thin films necessary for the formation of the circuit over the whole of its surface. These films consist successively starting from the substrate 1, of a film 2 of tantalum pentoxide, which is intended only to protect the substrate 1 against the reactants subsequently employed in the etching of some of the upper layers. This protective layer is well known to the person skilled in the art, and its use has been described in U.S. Pat. No. 3,220,938 applied for on the 9 Mar., 1961. The film of tantalum pentoxide may be produced by reactive cathode sputtering of a tantalum target in a vacuum vessel in which a partial oxygen pressure is established, in the well-known manner. The second film deposited on the substrate 1 is a layer of tantalum nitride 3 intended to constitute the pattern constituting the resistor network. This layer is obtained, for example, by reactive cathodic projection of tantalum in a vacuum vessel in which a partial nitrogen pressure is established. It will therefore be seen that the films 2 and 3 can readily be formed in the same enclosure from a common target, the usual precautions being taken to ensure purity of the gaseous media during the successive reactive cathodic projection steps. The thickness of the films 2 and 3 is of the order of 1,000 angstroms. The film 4 is a finer layer (of the order of 100 angstroms), of pure tantalum obtained, for example, by the same technique as the preceding layers, in the absence of active gas. The film 5 is a continuous layer of the metal intended to form the ohmic contact with the resistive pattern. This metal is generally gold. The layer 5 may also be obtained by cathode sputtering of a metallic target in a non-active atmosphere. The films 2, 3, 4 and 5 build the completed circuit: resistive pattern and connecting plugs. It will therefore not be necessary in any subsequent stage of the manufacture of the circuit to introduce the substrate into a vacuum vessel. The subsequent operations for the deposition of a mask and the chemical etching may be carried out under atmospheric pressure.

Figure 2:
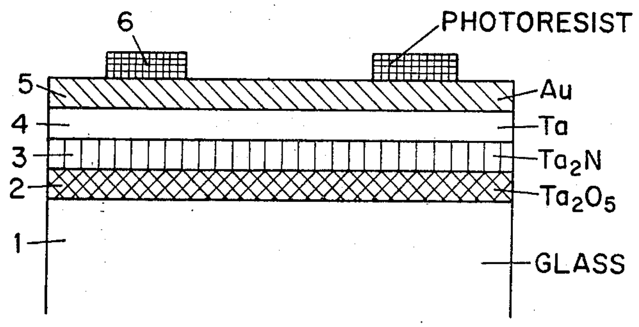

FIG. 2 illustrates diagrammatically the engraving of a contact consisting of the gold film 5 of FIG. 1. It requires a series of operations well known to the person skilled in the art, which can be summarised as follows. The areas on which the contacts are to be made are covered with a mask 6 formed from a continuous layer of photo-resist resin deposited upon the whole of the layer 5 and then exposed through a photographic film. The undesired portions of the resin layer are thereafter washed out in known manner. The layer 5 is then attacked by an appropriate reactant, which etches out those portions of the metal film 5 which are not protected by the mask 6. The reactant must not attack the layer 4. In the example given in the foregoing, this reactant may be aqua regia, which dissolves gold without attacking the tantalum. The mask 6 is then eliminated by any method known per se and the structure diagrammatically shown in FIG. 3 is obtained. The contact plugs are shown at $5_1$ and $5_2$.

The engraving of the desired resistor pattern is then carried out. The operations just described being repeated for the purpose of the engraving of the layer 4. 7 shows the mask intended to protect the areas of the resistive pattern against attack. The reactant employed in the attack is so chosen as to eliminate simultaneously the layer of tantalum and the layer of tantalum nitride. It is known that a mixture of hydrofluoric and nitric acids may be used to achieve this result. After elimination of the mask 7, the structure of the circuit has the form illustrated in FIG. 4. As has been stated in the foregoing, the layer 2 is only intended to protect the substrate 1 in the course of this acid attack. If other reactants are employed, it may be omitted. As is apparent, the resistive path consists essentially of a pattern engraved in the layer 3 of tantalum nitride which is covered with a tantalum film. Owing to the small thickness of the latter, it does not affect the stability of the resistance value. On the other hand, it may facilitate the adjustment of the resistance of the circuit to the required value after engraving, through anodic oxidation of the layer 4, as explained in U.S. Pat. No. 3,148,129 applied for on the 12 Oct., 1959, and British Pat. No. 1,243,830.

The ohmic contacts 5 produced in accordance with the invention have very good quality, both from the electrical and from the mechanical viewpoint. In a particular example, a gold wire having a diameter of 25 microns, welded by thermocompression to a contact produced in accordance with the invention, withstands a pull of 6 g.

FIG. 5 illustrates the various steps involved in carrying out the process for making ohmic contacts on thin-film circuits in accordance with the invention. Step 10 shows the preparation of the substrate (polishing, cleaning, etc.), for the purpose of giving the characteristics necessary for the deposition of thin films to at least one of its faces. The next step 11 consists in depositing over the whole of the surface of the substrate all the layers constituting the thin-film circuit in the order most favourable for its design, the last, upper layer consisting of a metallic film of the metal of the contacts. Step 12 sums up the operations of engraving the metallic layer which result in the elimination of the metal from the surface of the circuit to the exclusion of the contact areas or plugs. The contacts having been produced, the selective attacks are continued in the preferred embodiment of the invention for the purpose of effecting the engraving of the thin film pattern. These operations depend upon the type of circuit to be obtained. When the circuit has been completed, the contacts are used to interconnect the soldering of the thin film circuit to external circuit element or components depending upon the type of use under consideration.

FIG. 6 shows a hybrid circuit comprising the thin-film circuit and active components added to the circuit. The parts common to the circuit of FIG. 6 and to that of FIGS. 1 to 4 bear the same reference numerals. As will be seen, the conductive plug $5_1$ of the circuit of FIG. 4 is employed to interconnect the resistive pattern with an active component, for example a transistor consisting essentially of a small wafer of semiconducting material, for example silicon. The welding between the resistive circuit and the transistor 20 is obtained, by alloying, in the well-known manner. The use of a layer of tantalum 4 between the layer of nitride 3 and the contacts $5_1$, $5_2$ in accordance with the invention makes it possible to improve considerably the efficiency of the welding of the component 20. In the absence of this separating layer, experience shows that gold adheres insufficiently to the tantalum nitride to resist the attraction to form a gold-silicon alloy. Almost all the gold constituting the contact $5_1$ is then absorbed into the wafer 20 and the latter is not welded to the circuit. The layer of tantalum retains sufficient gold to provide a good interconnection.

FIG. 7 illustrates a second variant of an utilisation of contacts produced in accordance with the invention. The circuit consists entirely of thin films and is designed as a resistor- capacitor network. The contact plug $5_1$ of the circuit of FIG. 4 which contains only resistors, constitutes the lower electrode of a thin-film capacitor. 21 and 22 show respectively the dielectric and the counter-electrode of this capacitor, which are interconnected with the resistive network through electrode $5_1$. The layers 21 and 22 are obtained by deposition through a mask of a dielectric and a capacitor respectively, for example by cathode sputtering.

What we claim:

1. A process for manufacturing thin film circuits incorporating a tantalum nitride resistor pattern comprising the following steps:

introducing a clean dielectric substrate into a vacuum vessel;

sputtering a continuous tantalum nitride film on said substrate;

sputtering a continuous tantalum film on said nitride film sputtering a continuous contact metal film more conductive than tantalum on said tantalum film;

removing the resulting multi-layer sandwich from the vacuum vessel;

etching away portions of said metal film by a first photoengraving step; and etching away portions of said tantalum nitride films by a second photo-engraving step.

2. A manufacturing process for thin film circuits according to claim 1 in which said metal is gold.

3. A process for manufacturing thin film circuits incorporating a tantalum nitride resistor pattern comprising the following steps:

introducing a clean dielectric substrate into a vacuum vessel;

sputtering a continuous tantalum nitride film on said substrate;

sputtering a continuous tantalum oxide film on said substrate;

sputtering a continuous tantalum film on said nitride film;

sputtering a continuous contact metal film more conductive than tantalum on said tantalum film;

removing the resulting multi-layer sandwich from the vacuum vessel;

etching away portions of said metal film by a first photoengraving step; and etching away portions of said tantalum and tantalum nitride films by a second photo-engraving step.

4. A manufacturing process for thin film circuits incorporating a tantalum nitride resistor pattern comprising the following steps:

introducing a clean dielectric substrate into a vacuum vessel;

sputtering a continuous tantalum oxide film on said substrate;

sputtering a continuous tantalum nitride film on said substrate;

sputtering a continuous tantalum film on said nitride film;

sputtering a continuous contact metal film more conductive than tantalum on said tantalum film;

removing the resulting multi-layer sandwich from the vacuum vessel;

etching away portions of said film by a first photoengraving step;

etching away portions of said tantalum and tantalum nitride films by a second photo-engraving step; and etching away portions of said tantalum film from said tantalum nitride etched film.

* * * * *